(12) United States Patent
Kriebernegg et al.

(10) Patent No.: US 9,608,132 B2
(45) Date of Patent: Mar. 28, 2017

(54) OPTICAL SENSOR ARRANGEMENT AND METHOD FOR GENERATING AN ANALOG OUTPUT SIGNAL

(71) Applicant: ams AG, Unterpremstaetten (AT)

(72) Inventors: Josef Kriebernegg, Graz (AT); Christian Mautner, Fernitz (AT); Herbert Lenhard, Graz (AT); Manfred Lueger, Preding (AT)

(73) Assignee: AMS AG, Unterpremstaetten (AT)

( * ) Notice: Subject to any disclaimer, the term of this patent is extended or adjusted under 35 U.S.C. 154(b) by 26 days.

(21) Appl. No.: 14/850,908

(22) Filed: Sep. 10, 2015

(65) Prior Publication Data

US 2016/0079447 A1    Mar. 17, 2016

(30) Foreign Application Priority Data

Sep. 11, 2014 (EP) .................... 14184429

(51) Int. Cl.
| | |
|---|---|
| *H01J 40/14* | (2006.01) |
| *H01L 31/02* | (2006.01) |
| *G01S 17/02* | (2006.01) |
| *G01S 7/487* | (2006.01) |
| *H03M 1/12* | (2006.01) |

(Continued)

(52) U.S. Cl.
CPC ........ *H01L 31/02016* (2013.01); *G01S 7/487* (2013.01); *G01S 17/026* (2013.01); *G01V 8/10* (2013.01); *H01L 31/02002* (2013.01); *H03M 1/129* (2013.01); *G01S 17/10* (2013.01)

(58) Field of Classification Search
CPC ..... G01S 7/4912; G01S 7/4913; G01S 7/4918
USPC .... 250/205, 214 C, 214 B, 214 AL; 356/614
See application file for complete search history.

(56) References Cited

U.S. PATENT DOCUMENTS

| | | |
|---|---|---|
| 5,954,644 A | 9/1999 | Dettling et al. |
| 8,097,851 B2 * | 1/2012 | Chang ................. G01J 1/32 250/338.4 |

(Continued)

OTHER PUBLICATIONS

Davidovic, M. et al.: "A 33 X 25 μM2 Low-Power Range Finder", 2012 IEEE International Symposium on Circuits and Systems (ISCAS'12), Jan. 2012, pp. 922-925.

(Continued)

*Primary Examiner* — Kevin Pyo
(74) *Attorney, Agent, or Firm* — McDermott Will & Emery LLP

(57) ABSTRACT

An optical sensor arrangement (10) comprises a light sensor (11) that is connected to a summation node (13) and is designed for generating a sensor current (S2), a current source (S2) connected to the summation node (13) and designed to provide a source current (S3), and an integrator (21) that is coupled to the summation node (13) and is designed for generating a first value (VP1) of an integrator signal (S6) by integrating during a first phase (P1) and for generating a second value (VP2) of the integrator signal (S6) by integrating during a second phase (P2). The optical sensor arrangement (10) comprises a sum and hold circuit (31) that is coupled to the integrator (21) and is designed to generate an analog output signal (S7) as a function of a difference of the first value (VP1) and the second value (VP2) of the integrator signal (S6).

15 Claims, 4 Drawing Sheets

(51) Int. Cl.
*G01V 8/10* (2006.01)
*G01S 17/10* (2006.01)

(56) References Cited

U.S. PATENT DOCUMENTS

| | | | |
|---|---|---|---|
| 8,232,955 B2 * | 7/2012 | Kwon | G09G 3/3406 345/101 |
| 2011/0114842 A1 | 5/2011 | Ji et al. | |
| 2013/0120761 A1 | 5/2013 | Dyer et al. | |
| 2014/0166850 A1 | 6/2014 | Zheng | |

OTHER PUBLICATIONS

Perenzoni, M. et al.: "A 160x120-Pixels Range Camera With In-Pixel Correlated Double Sampling and Fixed Pattern Noise Correction", IEEE Journal of Solid-State Circuits, vol. 46, No. 7, Jul. 2011, pp. 1672-1681.

TCS3772 Data Sheet, "Color Light-to-Digital Converter with Proximity Sensing", TAOS145B—Sep. 2012, pp. 1-32.

* cited by examiner

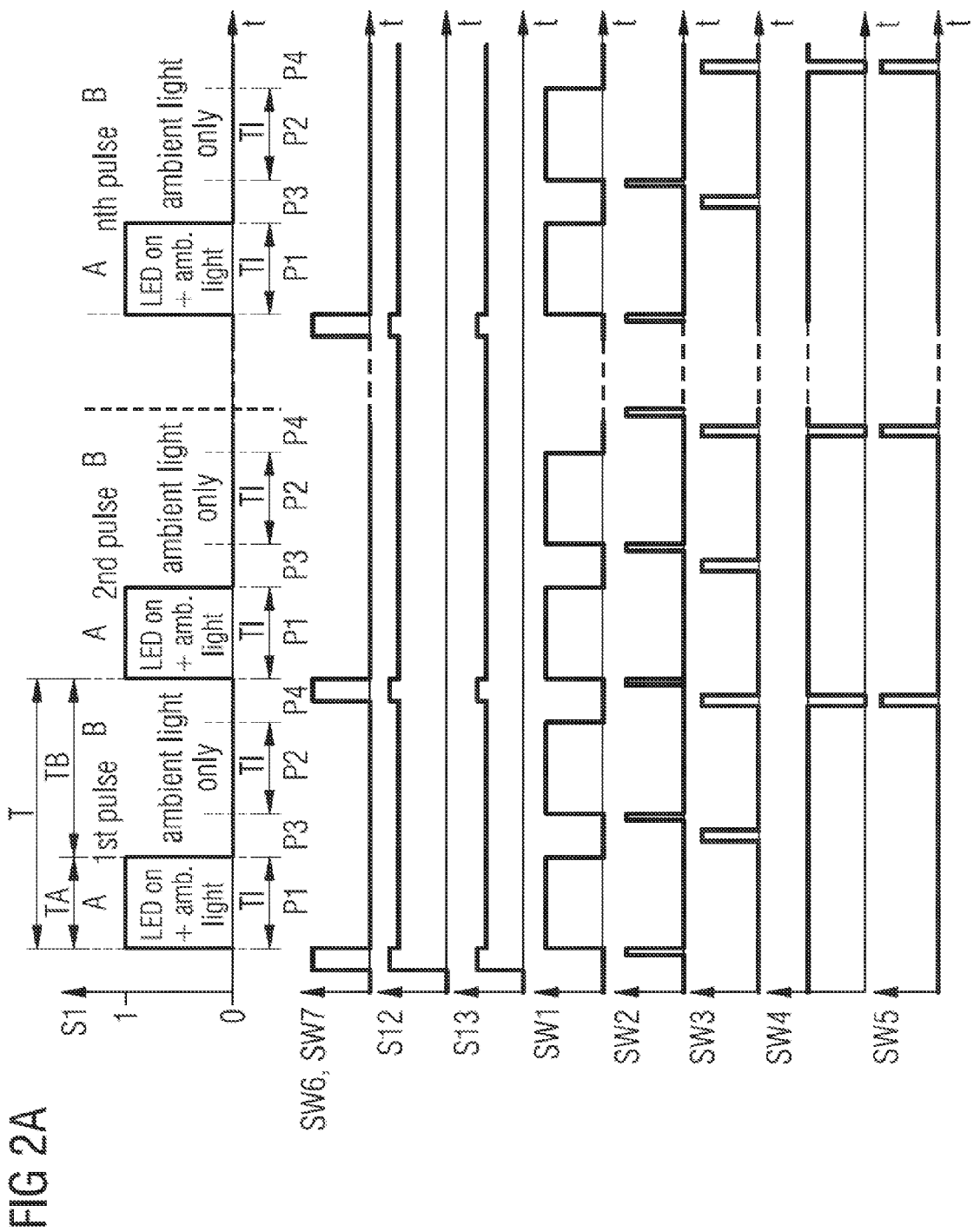

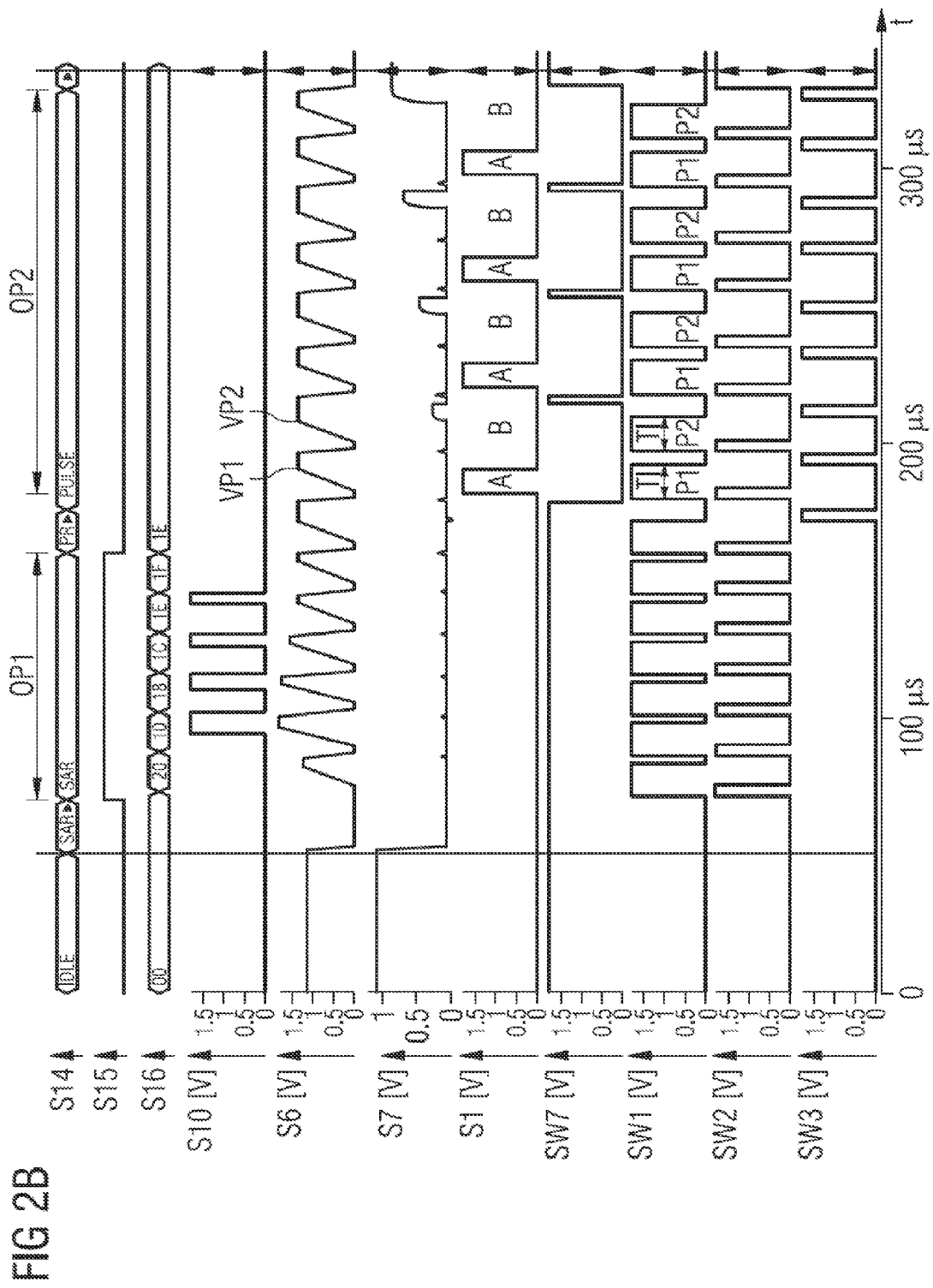

OPTICAL SENSOR ARRANGEMENT AND METHOD FOR GENERATING AN ANALOG OUTPUT SIGNAL

BACKGROUND OF THE INVENTION

The present application is related to an optical sensor arrangement and a method for generating an analog output signal.

An optical sensor arrangement can be realized for optical proximity detection and/or optical gesture detection. The optical sensor arrangement comprises a light source emitting light and measures the reflection of a target such as a hand being seen or moved over a light sensor. The light sensor not only detects light emitted by the light source and reflected by the target, but also detects ambient light. Very often, the ambient light is much stronger than the reflected light. The amount of reflected light by the target provides information about a distance and/or a location of the target. Ambient light is present which may force the optical sensor arrangement into saturation.

SUMMARY OF THE INVENTION

In an embodiment, an optical sensor arrangement comprises a light sensor that is connected to a summation node and is designed for generating a sensor current and a current source connected to the summation node and designed to provide a source current. Moreover, the optical sensor arrangement comprises an integrator and a sum and hold circuit. The comparator is coupled to the summation node and is designed for generating a first value of an integrator signal by integrating during a first phase and for generating a second value of the integrator signal by integrating during a second phase. The sum and hold circuit is coupled to the integrator and is designed to generate an analog output signal as a function of a difference of the first value and the second value of the integrator signal.

Advantageously, the current source reduces the influence of ambient light on the integrator signal and on the analog output signal. The source current may be determined such that it has a value comparable to the value of the sensor current if only ambient light falls on the light sensor. Thus, a saturation of the integrator and of the following sum and hold circuit can be avoided.

In an embodiment, the source current has an opposite current direction compared to the sensor current. A node signal can be tapped at the summation node. The node signal has the form of a current and flows from the summation node to an input of the integrator. The node signal is equal to a difference between the sensor current and the source current. In case only ambient light is detected by the light sensor, the node signal is very low.

In an embodiment, the optical sensor arrangement comprises a light source. The light source emits light during the first phase and is off during the second phase. Thus, the first value of the integrator signal depends on light emitted by the light source and reflected by a target, whereas the second value of the integrator signal does not depend on light emitted by the light source and reflected by the target. Both the first and the second value of the integrator signal depend on a residual influence of the ambient light. The residual influence results from a portion of the ambient light that is not compensated by the source current. The ambient light has a low influence on the analog output signal, since the sum and hold circuit forms a difference of the first and the second value of the integrator signal.

In an embodiment, the current source is realized as a controllable current source. Advantageously, the value of the source current can be adapted to a change of the ambient light. For example, the ambient light may be strong outside of a building and may be low inside of a building. The source current may be set by a control signal or a converter output signal.

In an embodiment, the optical sensor arrangement comprises a digital-to-analog converter, abbreviated to DA converter. The value of the source current is controlled by the DA converter. The output of the DA converter is coupled to a control terminal of the current source. The DA converter may generate the converter output signal for adjusting the source current.

In an embodiment, the current source comprises a current source transistor. A first terminal of the current source transistor is connected to the summation node. A control terminal of the current source transistor is coupled to the output of the DA converter. The control signal is applied to the control terminal of the current source transistor. A second terminal of the current source transistor may be coupled to a reference potential terminal or to a supply voltage terminal. The source current flows through a controlled section of the current source transistor. The current source transistor may be implemented as a field-effect transistor.

In an embodiment, the current source comprises a control capacitor. A first terminal of the control capacitor is connected to the control terminal of the current source transistor. A second terminal of the control capacitor may be connected to the reference potential terminal or to the supply voltage terminal. Advantageously, the control capacitor stabilizes the control signal provided to the control terminal of the current source transistor.

In a further development, the optical sensor arrangement comprises a control switch having a first terminal that is coupled to the output of the DA converter and a second terminal coupled to a node between the first terminal of the control capacitor and the control terminal of the current source transistor. The control switch additionally comprises a control terminal. During the first and the second phase, the control switch is in a non-conducting state. That means that there is no electrically conducting connection between the output of the DA converter to the node between the first terminal of the control capacitor and the control terminal of the current source transistor in the first and the second phase. Thus, the control signal at the control terminal of the current source transistor is constant during the first phase and during the second phase. Thus, noise generated by the DA converter and further circuit parts coupling the output of the DA converter to the control terminal of the current source transistor has only a very low influence on the source current.

In an embodiment, the value of the source current is constant during the first phase and the second phase and is equal in the first and the second phase. The value of the source current is only set in a phase before the first phase.

In an embodiment, the current source comprises a further transistor. The further transistor and the current source transistor form a current mirror. The further transistor comprises a first terminal that is connected to the output of the DA converter. A second terminal of the further transistor is coupled to the reference potential terminal or to the supply voltage terminal. The first terminal of the further transistor and a control terminal of the further transistor are connected to the first terminal of the control switch. The DA converter may be implemented as a converter generating the converter output signal in the form of a current. The DA converter is realized as a current digital-to-analog converter, abbreviated IDAC.

In an embodiment, the DA converter comprises a comparator on its input side. An output of the integrator is coupled to an input of the comparator.

In an embodiment, the DA converter operates according to a successive approximation routine, abbreviated to SAR.

In an embodiment, the optical sensor arrangement comprises a feeding switch coupling the summation node to the input of the integrator. The feeding switch is controlled such that the feeding switch is in a conducting state in the first and in the second phase. Moreover, the feeding switch is in a non-conducting state in periods that are not comprised by the first phase or the second phase. Thus, an input signal of the integrator is zero outside of the first phase and of the second phase. The input signal of the integrator is equal to the node signal only in the first phase and the second phase.

In an embodiment, a duration of the first phase is equal to a duration of the second phase. The driver signal of the light source has a pulse comprising an on-time and an off-time. The first phase may be arranged in the on-time. The second phase may be arranged in the off-time. A duration of the on-time may be equal or is larger than a duration of the first phase. A duration of the off-time may be equal or larger than a duration of the second phase. The duration of the on-time may not be equal to the duration of the off-time. The duration of the on-time may be smaller than the duration of the off-time to reduce power consumption.

In an embodiment, the integrator comprises an amplifier and an integrating capacitor. An input of the amplifier is connected to the input of the integrator. An output of the amplifier is connected to the output of the integrator. The integrating capacitor is arranged between the output of the amplifier and the input of the amplifier. The integrator signal can be tapped at the output of the amplifier. During the first phase, the node signal is provided via the feeding switch and is integrated by the amplifier and the integrated capacitor. Thus, the first value of the integrator signal is generated by integration of the node signal during the first phase. The second value of the integrator signal is generated by integrating the node signal in the second phase.

In an embodiment, the integrator additionally comprises a reset switch. The reset switch is also arranged between the output of the amplifier and the input of the amplifier. In a third phase, which is arranged between the first phase and the second phase, the reset switch is closed. Thus, the integrating capacitor is discharged and the value of the integrator signal is set to zero or a reference voltage again. In a fourth phase that is arranged between the second phase and a further first phase the reset switch is closed again to discharge the integrating capacitor and to set the value of the integrator signal back to zero or the reference voltage. During the first and the second phase, the reset switch is in a non-conducting state.

In a further development, the integrating capacitor has a variable capacitance value. The capacitance value of the integrating capacitor is controlled by a set signal. Thus, the gain of the integrator can be adjusted by the set signal. The set signal may be generated by a control circuit.

In an embodiment, the sum and hold circuit generates the analog output signal by subtracting the second value from the first value of the integrator signal or by subtracting the first value from the second value of the integrator signal which may be considered equivalent.

In a further development, the sum and hold circuit generates the analog output signal by capacitive subtracting the second value from the first value of the integrator signal or the first value from the second value of the integrator signal.

In an embodiment, the sum and hold circuit comprises a hold amplifier, a first series connection of an input switch and a storage capacitor and a second series connection of a hold capacitor and a hold switch. An output of the hold amplifier is connected to the output of the sum and hold circuit. The first series connection of the input switch and the storage capacitor couples the input of the sum and hold circuit to an input of the hold amplifier. The input switch is connected to the input of the sum and hold circuit, whereas the storage capacitor is connected to the input of the hold amplifier. The second series connection of the hold switch and the hold capacitor couples the input of the hold amplifier to the output of the hold amplifier.

In a further development, a resetting switch of the sum and hold circuit couples the output of the hold amplifier to the input of the hold amplifier. At an appropriate setting of the input switch, the hold switch and the resetting switch, the first value of the integrator signal is firstly stored by the sum and hold circuit at the end or shortly after the first phase and then the difference of the first value and the second value of the integrator signal is determined at the end or shortly after the second phase.

In an embodiment, the optical sensor arrangement comprises an analog-to-digital converter, abbreviated AD converter. An input of the AD converter is coupled to the output of the sum and hold circuit. The analog output signal may be fed to the AD converter that generates a digital output signal as a function of the analog output signal.

In an embodiment, more than one pulse is performed in a sample time. Thus, one value of the analog output signal that is fed to the AD converter is generated using more than one pulse of light emitted by the light source. In that case, the integrator generates a further first value of the integrator signal at the end of a further first phase and a further second value of the integrator signal at the end of a further second phase. The sum and hold circuit generates the analog output signal as a function of a difference of the sum of the first value and the further first value and the sum of the second value and the further second value. The analog output signal is generated by subtracting the sum of the second value and the further second value from the sum of the first value and the further first value or vice versa. In the case of three or more pulses, the integrator and the sum and hold circuit generate the analog output signal correspondingly.

In an embodiment, the optical sensor arrangement comprises a reference voltage source generating the reference voltage. The reference voltage source is coupled to a further input of the amplifier. The reference voltage source may also be coupled to a further input of the hold amplifier. The further input of the amplifier is coupled to the reference potential terminal via a sample capacitor. Moreover, a further sample capacitor couples the further input of the hold amplifier to the reference potential terminal. The sample capacitor and the further sample capacitor achieve a stabilization of a sample capacitor voltage provided to the further input of the amplifier and to the further input of hold amplifier.

In an embodiment, a reference switch of the optical sensor arrangement couples the reference voltage source to a node between the sample capacitor and the further input of the amplifier. Said node is connected to a node between the further sample capacitor and the further input of the hold amplifier. During the first and the second phase the reference switch is in a non-conducting state. Thus, a noise generated by the reference voltage source cannot influence the amplifier and the hold amplifier during the first and the second phase. In the phase before the first phase, the reference switch is in a conducting state. In this period, the reference voltage source charges the sample capacitor and the further sample capacitor at which the sample capacitor voltage can be tapped.

In an embodiment, the optical sensor arrangement comprises a pulse generator. A generator output of the pulse generator provides a driver signal to the light source. The driver signal comprises a series of at least one pulse during the sample time. During each pulse the light source emits light and during the times between the pulses the light source does not emit light. The sum and hold stage is configured to pulse-wise determine the difference of the first value and the second value of the integrator signal and to sum up the differences for generating the analog output signal.

In an alternative embodiment, an optical sensor arrangement comprises a light sensor designed for generating a sensor current, an integrator that is coupled to the light source and is designed for generating a first value of an integrator signal by integrating during a first phase and for generating a second value of the integrator signal by integrating during a second phase, and a sum and hold circuit that is coupled to the integrator and is designed to generate an analog output signal as a function of a difference of the first value and the second value of the integrator signal. Thus, the optical sensor arrangement may not comprise the current source. Saturation of the integrator may be avoided by e.g. appropriate setting a capacitance value of an integrating capacitor.

In an embodiment, a method for generating an analog output signal comprises generating a sensor current by a light sensor, providing the sensor current to a summation node and providing a source current by a current source to the summation node. Moreover, an integrator signal is generated by an integrator coupled to the summation node. A first value of the integrator signal is generated by integrating during a first phase and a second value of the integrator signal is generated by integrating during a second phase. Furthermore, an analog output signal is generated by a sum and hold circuit as a function of a difference of the first value and the second value of the integrator signal.

Advantageously, the source current is designed to at least partially cancel the influence of ambient light on the sensor current.

In an embodiment, the method performs an ambient light cancellation by the usage of the source current in combination with an afterwards pulse-wise elimination of the portion of the sensor current that is generated by ambient light. The method may be applied for gesture and/or proximity detection. The source current is provided by a converter output signal that is sampled and generated by an IDAC. Advantageously, the source current only obtains a low noise.

In an embodiment, the ambient light cancellation is based on a combination of an automatic SAR controlled IDAC—resulting in a rough or coarse ambient light current reduction—with a pulse-wise ambient light subtraction—resulting in a fine ambient light current cancellation. The source current is provided to an input of the integrator.

In an embodiment, a correlated noise sampling and signal hold method is performed by setting a reference switch respectively a control switch to reduce noise injected by the source current and by a reference voltage provided to the integrator and/or the sum and hold circuit. Both the reference switch and the control switch are controlled by the same switch signal. Advantageously, the dedicated timing of the switches results in a high efficiency of the ambient light cancellation.

BRIEF DESCRIPTION OF THE DRAWINGS

The following description of figures may further illustrate and explain exemplary embodiments. Insofar as components, circuits and method steps correspond to one another in terms of their function in different figures, the description thereof is not repeated for each of the following figures.

FIGS. 2A and 2B show exemplary embodiments of a timing of signals of the optical sensor arrangement.

DETAILED DESCRIPTION

Figure 1:
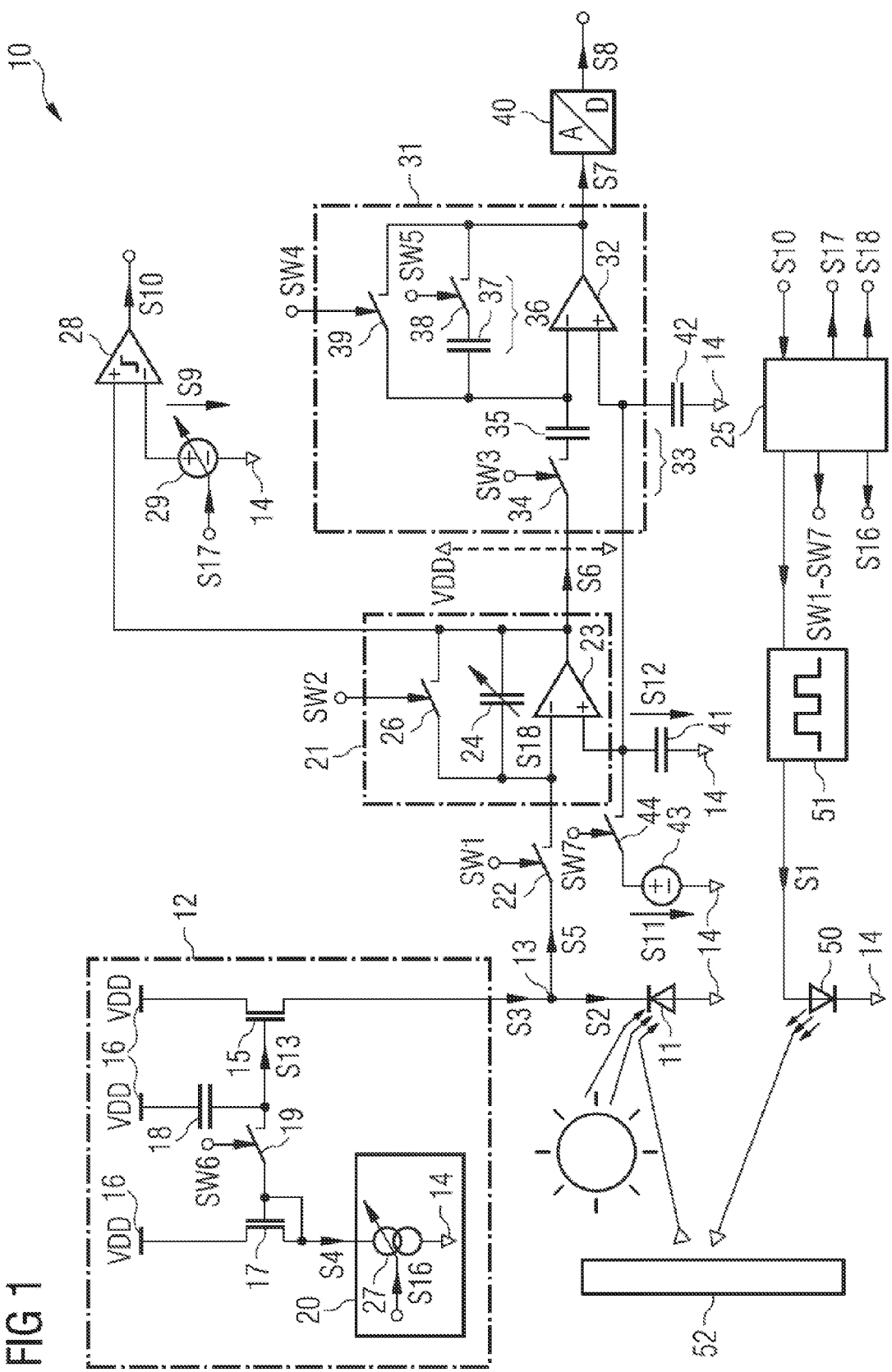
FIG. 1 shows an exemplary embodiment of an optical sensor arrangement.

FIG. 1 shows an exemplary embodiment of an optical sensor arrangement 10. The optical sensor arrangement 10 comprises a light sensor 11 and a current source 12, which are each connected to a summation node 13. Thus, the light sensor 11 is arranged between the summation node 13 and a reference potential terminal 14. The light sensor 11 is realized as a photodiode. An anode of the photodiode is connected to the reference potential terminal 14, whereas a cathode of the photodiode is connected to the summation node 13.

The current source 12 comprises a current source transistor 15 having a first terminal that is coupled to the summation node 13. A second terminal of the current source transistor 15 is coupled to a supply voltage terminal 16. Moreover, the current source 12 comprises a further transistor 17. The further transistor 17 and the current source 15 form a current mirror. Thus, a first terminal of the further transistor 17 is connected to a control terminal of the further transistor 17 and both of these terminals of the first transistor 17 are coupled to a control terminal of the current source transistor 15. A second terminal of the further transistor 17 is connected to the supply voltage terminal 16.

Moreover, the current source 12 comprises a control capacitor 18 that is arranged between the control terminal of the current source transistor 15 and the supply voltage terminal 16. A first terminal of the control capacitor 18 is permanently connected to the control terminal of the current source transistor 15. Furthermore, the current source 12 comprises a control switch 19 that is arranged in the connection between the current source transistor 15 and the further transistor 17. Thus, the control switch 19 has a first terminal connected to the control terminal and to the first terminal of the further transistor 17 and has a second terminal connected to a node between the control capacitor 18 and the control terminal of the current source transistor 15.

The optical sensor arrangement 10 comprises a digital-to-analog converter, abbreviated to DA converter, 20. The DA converter 20 is coupled to the control terminal of the current source transistor 15 via the current mirror. Thus, an output of the DA converter 20 is coupled to the first terminal of the further transistor 17. The DA converter 20 is arranged between the first terminal of the further transistor 17 and the reference potential terminal 14. The DA converter 20 has an output current source 27 at its output side. The output current source 27 is digitally controlled by a control circuit 25 of the optical sensor arrangement 10.

Additionally, the optical sensor arrangement 10 comprises an integrator 21 having an input that is coupled to the summation node 13. The optical sensor arrangement 10 comprises a feeding switch 22 that couples the summation node 13 to the input of the integrator 21. The integrator 21 comprises an amplifier 23 and an integrating capacitor 24. The integrating capacitor 24 has a variable capacitance value. The feeding switch 22 may directly connect the summation node 13 to the input of the integrator 21.

The control circuit 25 is coupled on its output side via a connection line, not shown, to a control terminal of the integrating capacitor 24 for determining a capacitance value of the integrating capacitor 24. An input of the amplifier 23 is connected to the input of the integrator 21. An output of the amplifier 23 is connected to an output of the integrator 21. The integrating capacitor 24 is arranged between the output of the amplifier 23 and the input of the amplifier 23.

Furthermore, the integrator 21 comprises a reset switch 26 that couples a first terminal of the integrating capacitor 24 to a second terminal of the integrating capacitor 24. An output of the integrator 21 is coupled to an input of the DA converter 20. The DA converter 20 comprises a comparator 28. An input of the comparator 28 is connected to the output of the integrator 21. A comparator reference source 29 couples a further input of the comparator 28 to the reference potential terminal 14. The comparator reference source 29 is controllable. The comparator reference source 29 is implemented as a further digital-to-analog converter.

The comparator 28, the comparator reference source 29, the control circuit 25 and the output current source 27 form the DA converter 20. The different parts of the DA converter 20 are placed on separate places in the schematic shown in FIG. 1. A connection line, which is not shown, connects an output of the comparator 28 to an input of the control circuit 25. Moreover, a connection line, also not shown, connects an output of the control circuit 25 to a control input of the comparator reference source 29. Additionally, a connection line, not shown, connects an output of the control circuit 25 to a control input of the output current source 27.

Additionally, the optical sensor arrangement 10 comprises a sum and hold circuit 31. An input of the sum and hold circuit 31 is connected to the output of the integrator 21. The sum and hold 31 comprises a hold amplifier 32 having an output that is connected to an output of the sum and hold circuit 31. Furthermore, the sum and hold circuit 31 comprises a first series connection 33 of an input switch 34 and a storage capacitor 35. The first series connection 33 couples an input of the hold amplifier 32 to the input of the sum and hold circuit 31. The input switch 34 is connected to the input of the sum and hold circuit 31, whereas the storage capacitor 35 is connected to the input of the hold amplifier 32.

Furthermore, the sum and hold circuit 31 comprises a second series circuit 36 of a hold capacitor 37 and a hold switch 38 which couple the output of the hold amplifier 32 to the input of the hold amplifier 32. The hold switch 36 is connected to the output of the hold amplifier 32, whereas the hold capacitor 37 is connected to the input of the hold amplifier 32. Additionally, the sum and hold circuit 31 comprises a resetting switch 39 that is arranged between the output of the hold amplifier 32 and the input of the hold amplifier 32.

Furthermore, the optical sensor arrangement 10 comprises an analog-to-digital converter 40, abbreviated as AD converter, having an input that is connected to the output of the sum and hold circuit 31.

The optical sensor arrangement 10 comprises a sample capacitor 41 that is arranged between a further input of the amplifier 23 and the reference potential terminal 14. Correspondingly, the optical sensor arrangement 10 comprises a further sample capacitor 42 that is arranged between a further input of the hold amplifier 32 and the reference potential terminal 14. A reference voltage source 43 of the optical sensor arrangement 10 is coupled to the sample capacitor 41 and the further sample capacitor 42.

A reference switch 44 is located between the reference voltage source 43 and the sample capacitor 41 and the further sample capacitor 42. A first terminal of the reference voltage source 43 is connected via the reference switch 44 to a first terminal of the sample capacitor 41. The first terminal of the sample capacitor 41 is connected to a first terminal of the further sample capacitor 42. The first terminal of the sample capacitor 41 is connected to the further input of the amplifier 23. Correspondingly, the first terminal of the further sample capacitor 42 is connected to the further input of the hold amplifier 32. The second terminal of the reference voltage source 43, the second terminal of the sample capacitor 41 and the second terminal of the further sample capacitor 42 are each connected to the reference potential terminal 14.

Additionally, the optical sensor arrangement 10 comprises a light source 50. The light source 50 may be fabricated as a light-emitting diode, abbreviated to LED. A pulse generator 51 of the optical sensor arrangement 10 is connected on its output side to the light source 50. The light source 50 may be arranged between an output of the pulse generator 51 and the reference potential terminal 14. A control input of the pulse generator 51 is connected to an output of the control circuit 25. The control circuit 25 is connected to the control terminal of each of the switches 19, 22, 26, 34, 38, 39, 44 of the optical sensor arrangement 10 by not shown connecting lines.

The light source 50 and the light sensor 11 are arranged in such a manner that light emitted by the light source 50 falls on the target 52 and light reflected by the target 52 is detected by the light sensor 11.

The optical sensor arrangement 10 is configured for proximity and/or gesture detection. The light detected by the light sensor 11 is a function of a distance of the target 52 to the light source 50 and to the light sensor 11. Additionally, ambient light, for example emitted by the sun 53, may be detected by the light sensor 11.

The pulse generator 51 generates a driver signal S1 that is provided to the light source 50. The light sensor 11 generates a sensor current S2. The sensor current S2 flows from the summation node 13 via the light sensor 11 to the reference potential terminal 14. Thus, a positive current flows from the summation node 13 to the reference potential terminal 14 via the light sensor 11. The current source 12 generates a source current S3. A positive source current S3 flows from the output of the current source 12 to the summation node 13. The source current S3 flows from the supply voltage terminal 16 via the source current transistor 15 to the summation node 13.

The source current S3 is provided by mirroring a converter output signal S4. The converter output signal S4 is provided by the DA converter 20. The converter output signal S4 has the form of a current. The converter output signal S4 flows through the further transistor 17 and through the output current source 27 of the DA converter 20. A node signal S5 flows from the summation node 13 to the integrator 21 via the feeding switch 22. The node signal S5 is a function of a difference of the sensor current S2 and of the source current S3. The node signal S5 has the form of a current. The node signal S5 can be calculated according to the following equation:

$$S5=S3-S2$$

The node signal S5 is provided to the input of the integrator 21. The integrator 21 generates an integrator signal S6 at the output of the integrator 21 as a function of the node signal S5. Integration is performed when the feeding switch 22 is in a conducting state and the reset switch 26 is in a non-conducting state.

The integrator signal S6 is provided to the sum and hold circuit 31. The integrator signal S6 is able to charge the storage capacitor 35 in case the input switch 34 is in a conducting state. The sum and hold circuit 31 generates an analog output signal S7. The analog output signal S7 is generated by summing and subtraction of different values of the integrator signal S6 by the sum and hold circuit 31. The analog-to-digital converter 40 generates a digital output signal S8 as a function of the analog output signal S7 at the end of a sample time.

The integrator signal S6 is additionally provided to the input of the comparator 28. The controllable comparator reference source 29 generates a comparator threshold voltage S9 that is applied to the further input of the comparator 28. The comparator 28 generates a comparator signal S10 as a function of a comparison of the integrator signal S6 and the comparator threshold voltage S9. The comparator signal S10 is provided to the control circuit 25.

The reference voltage source 43 generates a reference voltage S11. The reference voltage S11 is provided via the reference switch 44 to the first terminals of the sample capacitor 41 and of the further sample capacitor 42 and, thus, to the further terminals of the amplifier 23 and of the hold amplifier 32. A sample capacitor voltage S12 can be tapped at the sample capacitor 41 and the further sample capacitor 42. The sample capacitor voltage S12 is equal to the reference voltage S11, when the reference switch 44 is in a conducting state. The sample capacitor voltage S12 may be equal or smaller than the reference voltage S11, when the reference switch 44 is in a non-conducting state.

The comparator 28, the control circuit 25 and the comparator reference source 29 form a loop. The comparator 28, the control circuit 25 and the comparator reference source 29 are configured to generate a digital value of the integrator signal S6, for example by using a successive approximation routine. Thus, the comparator 28, the control circuit 25 and the comparator reference source 29 realize an analog-to-digital converter.

The DA converter 20 couples the output of the integrator 21 to the current source 12. The DA converter 20 couples the output of the integrator 21 to the control terminal of the current source transistor 15. The data signal S16, the converter output signal S4, the control signal S13 and, thus, the source current S3 are a function of the integrator signal S6. The control circuit 25 sets the data signal S16 such that the influence of the ambient light on the comparator signal S10 is reduced.

The DA converter 20 comprises the output current source 27 and the analog-to-digital converter realized by the comparator 28, the control circuit 25 and the comparator reference source 29. The data signal S16, the converter output signal S4, the control signal S13 and, thus, the source current S3 are a function of the digital value of the integrator signal S6 and are determined such that the influence of the ambient light on the comparator signal S10 is reduced.

The timing of the signals as a function of a time t is further explained in FIGS. 2A and 2B.

In an alternative, not shown embodiment, the light sensor 11 is connected between the supply voltage terminal 16 and the summation node 13 and the current source transistor 15 is connected between the summation node 13 and the reference potential terminal 14.

In an alternative, not shown embodiment, the further inputs of the amplifier 23 and the hold amplifier 32 are connected to the reference potential terminal 14.

FIG. 2A shows an exemplary embodiment of a timing of signals of the optical sensor arrangement 10 shown in FIG. 1. FIG. 2A shows, from top to bottom, the driver signal S1, a sixth switch signal SW6 that is provided to the control switch 19, a seventh switch signal SW7 provided to the reference switch 44, a sample capacitor voltage S12, a control signal S13 provided to the control terminal of the current source transistor 15, a first switch signal SW1 provided to the feeding switch 22, a second switch signal SW2 of the reset switch 26, a third switch signal SW3 of the input switch 34, a fifth switch signal SW5 of the hold switch 38 and a fourth switch signal SW4 of the resetting switch 39. The driver signal S1 comprises at least one pulse. The sixth switch signal SW6 and the seventh switch signal SW7 may be identical.

In the exemplary embodiment shown in FIG. 2A, the driver signal S1 comprises three pulses. Each of the pulses has a duty cycle comprising an on-time A and an off-time B. A duration T of the duty cycle is equal to a sum of a duration TA of the on-time A and a duration TB of the off-time B. Thus, the duty cycle T follows the equation:

$$T=TA+TB$$

The on-time A comprises a first phase P1. The first phase P1 may be equal to the on-time A. During the first phase P1, the light source 50 emits light and, thus, reflected light and ambient light is detected by the light sensor 11 generating the sensor signal S2. The duration of the first phase P1 is equal to an integration time TI of the integrator 21. The off-time B comprises a second phase P2. A duration of the second phase P2 is less than the duration TB of the off-time B. The duration of the second phase P2 may be equal to the duration of the first phase P1. Thus, the duration of the second phase P2 is also equal to the integration time TI. The off-time B comprises a third phase P3. Additionally, as shown in FIG. 2A, the off-time B may also comprises a fourth phase P4. The third phase P3 may be between the first phase P1 and the second phase P2. The fourth phase P4 may be between the second phase P2 and the on-time A of the next pulse.

During the off-time B the light source 50 does not emit light. Thus, the light sensor 11 only detects ambient light. The sensor signal S2 represents the ambient light during the second phase P2. At the end of the first phase P1 a first value VP1 of the integrator signal S6 is generated as a function of the node signal S5 during the first phase P1. Correspondingly, at the end of the second phase P2 a second value VP2 of the integrator signal S6 is generated as a function of the node signal S5 during the second phase P1. A timing of the second and the third pulse is equal to the timing of the first pulse of the driver signal S1.

As shown in FIG. 2A, the control switch 19 and the reference switch 44 are in a conducting state during a small pulse which falls into the fourth phase P4. Thus, the control signal S13 is provided to the current source transistor 15 and the reference voltage S11 is applied to the sample capacitor 41 and the further sample capacitor 42. When the control switch 19 and the reference switch 44 are set in a non-conducting state again, a small drop of the control signal S13 of the current source transistor 15 and of the sample capacitor voltage S12 that can be tapped across the sample capacitor 41 and the further sample capacitor 42 occurs.

However, the control signal S13 of the current source transistor 15 is stable during the first and the second phase P1, P2 and the source current S3 has only noise generated by the current source transistor 15 and is free of noise from other noise sources. Correspondingly, the sample capacitor voltage S12 is stable during the first and the second phase P1, P2 and only shows an extremely low noise level, since the sample capacitor 41 and the further sample capacitor 42 are free from a connection to a noise source in the first and in the second phase P1, P2.

In the first and in the second phase P1, P2 the feeding switch 22 that is driven by the first switch signal SW1 is in a conducting state. Thus, the first switch signal SW1 determines the integration time TI. At the end of the third phase P3 and of the fourth phase P4, the integrating capacitor 24 of the integrator 21 is discharged again by the reset switch 26 controlled by the second switch signal SW2. In the third and in the fourth phase P3, P4, the input switch 34 is set in a conducting state by the third switch signal SW3. Thus, the first value VP1 of the integrator signal S6 that can be tapped at the end of the first phase P1 and the second value VP2 of the integrator signal S6 that can be tapped at the end of the second phase P2 are provided via the input switch 34 to the storage capacitor 35 of the sum and hold circuit 31. During the pulse of the third switch signal SW3 for closing the input switch 34 during the fourth phase P4, the hold switch 38 is set in a conducting state and the resetting switch 39 is set in a non-conducting state by the fourth and fifth switch signals SW4, SW5. During other phases, namely the first, the second and the third phase P1, P2, P3, the hold switch 38 is in a non-conducting state and the resetting switch 39 is in a conducting state.

By this switching scheme, a subtraction of the first value VP1 of the integrator signal S6 from the second value VP2 of the integrator signal S6 is achieved. Alternatively, a subtraction of the second value VP2 of the integrator signal S6 from the first value VP1 of the integrator signal S6 may be performed.

In proximity respectively gesture applications, not only light that is sent out by the light source 50 and reflected by the target 52 arrives at the light sensors 11, but also ambient light. The light source 50 is implemented as LED. The light sensor 11 is fabricated as photo diode. This ambient light is very often a slow changing light such as sunlight, but might be very bright. For proximity and/or gesture detection, the subtraction of the ambient light current from the reflected target photo current occurs pulse-wise. This is done in two phases:

First phase P1: Reflected light current with the light source 50 that is on and ambient light current is integrated by the integrating capacitor 24 and then the first value VP1 of integrator signal S6 is stored at the storage capacitor 35 (the input switch 34 is closed; the hold amplifier 32 is used as a follower with the resetting switch 39 closed and the hold switch 38 open).

Second phase P2: After discharging the integrating capacitor 24 again by the reset switch 26, now only ambient light photo current is integrated by the integrating capacitor 24 and the hold amplifier 32 is changed to a so called sum and hold configuration (the hold switch 38 is closed, the resetting switch 39 is open). The second value VP2 of the integrator signal S6 of the amplifier 23 is then connected to the storage capacitor 35 by closing the input switch 34 and as a consequence of this, the difference of the two values (VP2−VP1) is amplified by the ratio of the capacitance value of the storage capacitor 35 divided by the capacitance value of the hold capacitor 37 and finally kept stored at the hold capacitor 37 of the sum and hold circuit 31. Thus, the ambient light current is cancelled.

The sequence of the first phase P1 followed by the second phase P2 and so on will be continued as long as pulses are sent out by the driver signal S1 (e.g. 16 pulses). After this the final voltage of the analog output signal S7 at the output of the sum and hold circuit 31, stored at the hold capacitor 37 at the output of the hold amplifier 32, is handed over to the AD converter 40 and converted into the digital domain.

The generated digital output signal S8, together with the known number of pulses being sent out by the driver signal S1, represents the distance respectively the location of the target 52, e.g. in a gesture application.

The maximum ambient light level which can be handled by the optical sensor arrangement 10 is determined by the integrator 21, where the voltage value of the integrator signal S6 has to stay within a supply rail ranging from a supply voltage VDD at the supply voltage terminal 16 to the reference voltage S11. The voltage value of the integrator signal S6 gets higher with higher ambient light current, lower capacitance value of the integrating capacitor 24 and higher integration time TI. This means saturation of the integrator signal S6—voltage touches the supply rail—will occur easily, unless prevented by the cancellation using the source current. A low capacitance value of the integrating capacitor 24 results in a high signal gain. In other words, with high signal gain (low capacitance value of the integrating capacitor 24) and long integration time TI, the influence of the ambient light on the node signal S5 must be kept small to allow proper functionality of the integrator 21. The capacitance value of the integrating capacitor 24 is determined by a set signal S18 generated by the control circuit 25. The integrating capacitor 24 may at least obtain two different capacitance values. The set signal 18 may select one of the at least two different capacitance values.

Alternatively, the integrating capacitor 24 may at least obtain four different capacitance values. The set signal 18 may select one of the at least four different capacitance values. Each of the at least two or four different capacitance values may be non-zero.

With the introduction of the source current S3 provided by the IDAC 20 at the input of the integrator 21, the output voltage saturation limit problem is greatly minimized independent of the chosen gain of the integrator 21 (determined by the capacitance value of the integrating capacitor 24) and the integration time TI. The right value of the source current S3 is found by running a so called successive approximation routine, abbreviated to SAR, in combination with the comparator signal S10 of the comparator 28.

FIG. 2B shows a further exemplary embodiment of the timing of the signals of the optical sensor arrangement 10 shown in FIG. 1. The optical sensor arrangement 10 is operated by a first operation phase OP1 and a second operation phase OP2 which follows the first operation phase OP1. The first operation phase OP1 is called a rough or coarse ambient light cancellation operation phase. In the first operation phase OP1 the successive approximation routine is performed. During the first operation phase OP1 the value of the source current S3 is determined which will then be used in the second operation phase OP2. The second operation phase OP2 can be called a light source driver phase. During the second operation phase OP2, the light source 50 emits pulses according to the driver signal S1. The second operation phase OP2, shown in FIG. 2B, corresponds to the procedure shown in FIG. 2A. The sample time comprises the first and the second operation phase P1, P2. One value of the analog output signal S7 that is digitized into the digital output signal S8 is generated in one sample time.

The timing of the following signals is shown in FIG. 2B from the top to the bottom: a state string signal S14 first keeps the optical sensor arrangement 10 in an idle state, then triggers the first operation phase OP1 and then triggers the second operation phase OP2. An ambient cancellation active signal S15 has a first logical value 1 during the successive approximation routine. In the other periods the ambient cancellation active signal S15 has the logical value zero. A data signal S16 comprises the data that are converted in an analog signal by the DA converter 20. The data signal S16 controls the value of the source current S3. The data signal S16 is generated by the control circuit 25.

The comparator signal S10 can be tapped at the output of the comparator 28. The integrator signal S6 can be tapped at the output of the integrator 21. The comparator signal S10 is a function of the difference of the integrator signal S6 and the comparator threshold voltage S9. The analog output signal S7 is tapped at the output of the sum and hold circuit 31 and is provided to the analog-to-digital converter 40 at the end of the second operation phase OP2. The driver signal S1 shows pulses only during the second operation phase OP2. In the first operation phase OP1, the pulse generator 51 does not emit pulses and therefore the light source 50 does not emit light. Moreover, the seventh switch signal SW7 is shown that is provided to the control switch 19. The first switch signal SW1 is supplied to the feeding switch 22. The second switch signal SW2 is provided to the reset switch 26. The third switch signal SW3 is applied to the input switch 34.

In an exemplary embodiment of the optical sensor arrangement 10, the data signal S16 comprises six bits. As can be seen in FIG. 2B when the most significant bit of the data signal S16 is set, the integrator signal S6 is smaller than the comparator threshold voltage S9 such that the comparator signal S10 has a logical value zero. When the most significant bit is set to zero and the next significant bit is set to one, the integrator signal S6 is larger than the comparator threshold voltage S9 such that the comparator signal S10 obtains the logical value one. Thus, said next significant bit remains set to the logical value of one. The third to the sixth bits are determined in a corresponding manner.

In the second operation phase OP2, the data signal S16 remains constant, thus the value of the source current S3 also remains constant during the second operation phase OP2. The analog output signal S7 is increased during the off-times B of the driver signal S1. The reference switch 44 is continuously in a conducting state during the first operation phase OP1. During the second operation phase OP2, the reference switch 44 is in a non-conducting state except for a short period before the end of the off-time B. Thus, the reference voltage S11 provided to the amplifier 23 and the hold amplifier 32 is refreshed before a further pulse of the driver signal S1 starts. During the first operation phase OP1, the feeding switch 22 and the reset switch 26 are selectively set in a conducting and in a non-conducting state for integration of the node signal S5. The integrator signal S6 is only provided to the comparator 28 and not to the sum and hold circuit 31 in the first operating phase OP1.

In FIG. 2B, an overall proximity and/or gesture sequence timing example of the optical sensor arrangement 10 is shown. Prior to the pulse emission of the driver signal S1, a so called rough ambient light cancellation sequence is initiated by the control circuit 25 to find the suitable value of the source current S2 to roughly compensate for the ambient light current by the SAR sequence, see FIG. 2B with the ambient cancellation active signal equals 1. The control circuit 25 is realized as a digital circuit.

The SAR rough ambient light cancellation procedure takes place prior to the pulse burst emission and is described in the following. Prior to the burst emission of the light source 50, the following is done:

Close the reference switch 44=>the reference voltage S11 is driven directly.

Set the most significant bit, abbreviated as MSB, of the IDAC 20.

The reset switch 26 is closed to discharge the integrating capacitor 24.

Close the feeding switch 22 and open the reset switch 26=>the node signal S5 charges the integrating capacitor 24 and is equal to the sensor current S2 generated by ambient light minus the source current S2 at the MSB provided to the IDAC 20.

After the integration time TI (e.g. 4 µs or 8 µs or 16 µs or 32 µs) open the feeding switch 22.

If the held voltage value of the integrator signal S6 is higher than the comparator threshold voltage S9, then the comparator signal equals 1 and MSB is kept to 1 (otherwise reset MSB to 0).

Set the second most significant bit, abbreviated as MSB−1 of the IDAC 20.

The reset switch 26 is closed to discharge the integrating capacitor 24.

Close the feeding switch 22 and open the reset switch 26=>The node signal S5 charges the integrating capacitor 24 and is equal to the sensor current S2 generated by ambient light minus the source current S2 at the MSB−1 and the set/reset MSB provided to the IDAC 20.

After the integration time TI (e.g. 4 µs or 8 µs or 16 µs or 32 µs) open the feeding switch 22.

If held voltage value of the integrator signal S6 is higher than the comparator threshold voltage S9, then the comparator signal equals 1 and MSB−1 is kept to 1 (otherwise reset MSB−1 to 0).

Continue the steps above until the least significant bit, abbreviated as LSB, of the IDAC 20 is reached and SAR sequence is completed.

After this SAR procedure the value of the input signal of the IDAC 20 and thus, the value of the source current S3 is found that roughly compensates the ambient light photo current. Since ambient light such as sunlight does not change that fast, this rough ambient light cancellation with the appropriate source current S3 is only done once prior to the afterwards starting emission of the burst of the driver signal S1. Alternatively, it can be done prior to every pulse within one pulse burst of the driver signal S1.

The level of ambient light current reduction can be chosen by the adjustable comparator threshold voltage S9. The comparator reference source 29 is realized as a voltage DA converter and provides this adjustable comparator threshold voltage S9. The comparator reference source 29 is controlled by a comparator reference data signal S17 generated by the control circuit 25.

The combination of the current source 12 and of the integrator 21 may be named ambient light subtractor, since a rough ambient light subtraction is achieved by the current source 12 and the integrator 21.

In the second phase P2, a pulse-wise fine ambient light cancellation is performed in combination with correlated noise sampling using the reference switch 44 and the control switch 19. The ambient light cancellation is provided pulse-wise for every emitted pulse, as elucidated in FIG. 2B. To reduce noise injection within the overall proximity and/or gesture channel, dedicated sampling methods are used, as described in the following.

The reference voltage S11 is sampled by the reference switch 44. Since the output voltages of the amplifier 23 and of the hold amplifier 32 refer to the reference voltage S11, noise of the reference voltage S11 would be taken into account during voltage subtraction (VP2−VP1). With sampling of the reference voltage S11 by the reference switch 44 prior to every pulse emission and keeping the sample capacitor voltage S12 stored at the sample capacitor 41 during the whole single pulse, the noise impact of the reference voltage S11 on the analog output signal S7 is reduced substantially. The pulse has a period consisting of the on-time A and the off-time B.

The same procedure is applied to the current source 12 as described in the following. The sampling of the source current S3 is performed using the control switch 19. Parallel to the sampling of the reference voltage S11 voltage by the reference switch 44, the control signal S13 at the control terminal of the current source transistor 15 is sampled simultaneously via the control switch 19. The current source transistor 15 and the further transistor 17 are fabricated as field-effect transistors. Their control terminals are realized as gates. A gate voltage at the current source transistor 15 is kept by the control capacitor 18 over the whole single pulse period consisting of the on-time A and the off-time B. This leads to the advantage that only the current source transistor 15 acts as a noise contributor. This transistor 15 can now operate in a very low noise operating condition (e.g. large difference between a gate-to-source voltage and a threshold voltage etc.). The overall noise coming from the source current S3, for rough ambient light current reduction, is minimized at best.

Figure 3:
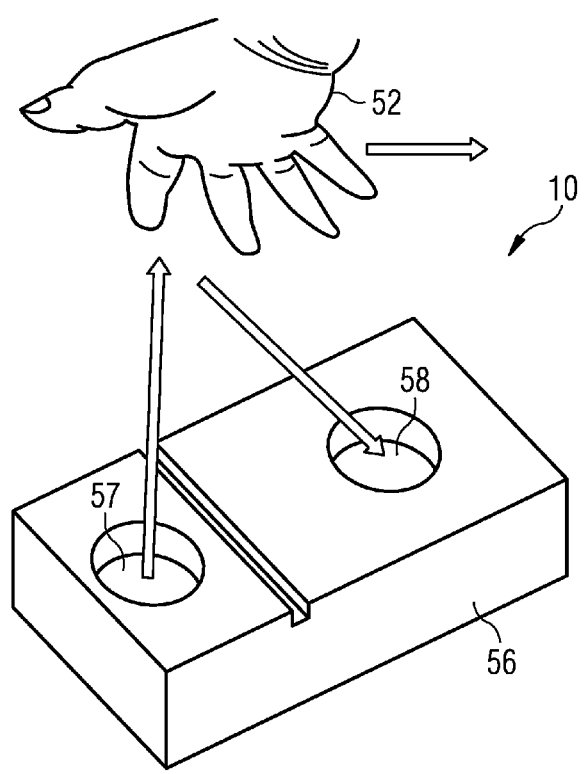
FIG. 3 shows an exemplary embodiment of a spatial arrangement of the optical sensor arrangement.

FIG. 3 shows an exemplary embodiment of a spatial arrangement of the optical sensor arrangement 10. The optical sensor arrangement 10 is enclosed in a housing 56. The housing 56 has a first transparent portion 57 under which the light source 50 is arranged. Moreover, the housing 56 has a second light transparent portion 58 under which the light sensor 11 is located. The light source 50 emits light through the first transparent portion 57. The emitted light is reflected by a target 52 which may be a hand. The target 52 may be named as an object. The reflected light is detected by the light sensor 11 through the second transparent portion 58. Thus, the analog output signal S7 is a function of a distance of the hand to the light source 21 and/or the light sensor 11.

In case an optical arrangement comprises more than one optical sensor arrangement 10, the direction of the movement of the target 52 can be detected. This allows a gesture detection.

Alternatively, the optical arrangement comprises at least one light source 50 and at least one light sensor 11. The optical arrangement may be configured for optical proximity detection. The number of light sources 21 and the number of light sensors 11 may be exactly one.

Alternatively, the optical arrangement comprises at least one light source 50 and at least two light sensors 11. The optical arrangement may be configured for optical gesture detection and/or optical proximity detection. The number of light sources 50 may be smaller than the number of light sensors 11. The number of light sources 50 may be exactly one. The number of light sensors 11 may be four. The at least one light source 50 is used for emitting light, wherein the reflected light is detected by the at least two light sensors 11. Each of the light sensors 11 is coupled to a separate current source 12 and a separate integrator 21 followed by a separate sum and hold circuit 31 as shown in FIG. 1A.

The optical gesture respectively proximity detection working procedure is elucidated by FIG. 2B. Advantageously, the optical sensor arrangement 10 improves the suppressing and separating of the ambient photo current from the target reflected light photo current. It makes it possible for proximity and/or gesture devices to work under strong ambient light conditions without any signal saturation independent of the signal gain setting.

The driver signal S1 performs a so called multiple pulse emission, so ambient light subtraction is done pulse-wise as well. The ambient light current subtraction is achieved during pulse burst emission.

The optical sensor arrangement 10 uses the implementation of the pulse-wise ambient light cancellation and a further ambient light current suppressor implemented by the low noise source current S3 provided to the input of the proximity/gesture integrator 21 in parallel to the light sensor 11 in the form of a photo diode. The optical sensor arrangement 10 is based on the combination of these two functionalities embedded in an arrangement using correlated noise sampling to reduce circuit noise substantially.

The combination of the source current S3 determined by the IDAC 20 at the input of the integrator 21 in conjunction with the aforementioned pulse-wise ambient light subtraction overcomes the problem of different required software settings. For instance, indoor has normally low ambient light and might use high signal gain in contrast to outdoor, where only low signal gains can be used due to the possible presence of very high ambient light.

The usage of the source current S3 that is automatically controlled by the IDAC 20 at the input of the integrator 21 makes it possible to prevent saturation due to strong ambient light current. The value of the source current S3 corresponds to the ambient light photo current and is found by the so called SAR control loop. During pulse emission, a correlated sample and hold method is used to generate the source current S3 with only ultralow noise.

Together, this leads to a wider ambient light cancellation range independent of the proximity and/or gesture signal gain settings. The optical sensor arrangement 10 is configured for proximity and/or gesture detection and may use one common setting for indoor and outdoor.

We claim:
1. An optical sensor arrangement, comprising:
a light sensor that is connected to a summation node and is designed for generating a sensor current,
a current source connected to the summation node and designed to provide a source current,
an integrator that is coupled to the summation node and is designed for generating a first value of an integrator signal by integrating during a first phase and for generating a second value of the integrator signal by integrating during a second phase and
a sum and hold circuit that is coupled to the integrator and is designed to generate an analog output signal as a function of a difference of the first value and the second value of the integrator signal.

2. The optical sensor arrangement according to claim 1, comprising a digital-to-analog converter, wherein a value of the source current is controlled by the digital-to-analog converter.

3. The optical sensor arrangement according to claim 2, wherein the current source comprises a current source transistor with a first terminal connected to the summation node and a control terminal coupled to an output of the digital-to-analog converter.

4. The optical sensor arrangement according to claim 3, wherein the current source comprises a control capacitor having a first terminal connected to the control terminal of the current source transistor and a control switch having
a first terminal coupled to the output of the digital-to-analog converter,
a second terminal coupled to a node between the first terminal of the control capacitor and the control terminal of the current source transistor, and
a control terminal.

5. The optical sensor arrangement according to claim 3, wherein the current source comprises a further transistor that forms a current mirror with the current source transistor and comprises a first terminal that is connected to the output of the digital-to-analog converter.

6. The optical sensor arrangement according to claim 2, wherein the digital-to-analog converter comprises a comparator and the output of the integrator is coupled to an input of the comparator.

7. The optical sensor arrangement according to claim 2, wherein the digital-to-analog converter operates according to a successive approximation routine.

8. The optical sensor arrangement according to claim 1, comprising a feeding switch arranged between the summation node and an input of the integrator and controlled such that the feeding switch is in a conducting state in the first and in the second phase and in a non-conducting state outside of the first and the second phase.

9. The optical sensor arrangement according to claim 1, wherein the integrator comprises
an amplifier having an input coupled to an input of the integrator and an output coupled to an output of the integrator, and
an integrating capacitor coupling the output of the amplifier to the input of the amplifier.

10. The optical sensor arrangement according to claim 9, wherein the integrating capacitor is configured such that a capacitance value of the integrating capacitor is controlled by a set signal.

11. The optical sensor arrangement according to claim 1, wherein the sum and hold circuit provides a capacitive subtraction of the second value of the integrator signal from the first value of the integrator signal or a capacitive subtraction of the first value of the integrator signal from the second value of the integrator signal.

12. The optical sensor arrangement according to claim 1, wherein the sum and hold circuit comprises
a hold amplifier having an output coupled to an output of the sum and hold circuit,
a first series connection that comprises an input switch and a storage capacitor and is connected between an input of the sum and hold circuit and an input of the hold amplifier,
a second series connection that comprises a hold capacitor and a hold switch and is connected between the input of the hold amplifier and the output of the hold amplifier, and
a resetting switch coupling the output of the hold amplifier to the input of the hold amplifier.

13. The optical sensor arrangement according to claim 1, comprising a pulse generator having a generator output for providing a driver signal to a light source such that the light source emits light at least during the first phase and the light source is off at least during the second phase.

14. The optical sensor arrangement according to claim 13, wherein the pulse generator is configured such that the driver signal comprises a series of at least two pulses and the sum and hold circuit is configured to pulse-wise generate the difference of the first value and the second value of the integrator signal and sum the differences.

15. A method for generating an analog output signal, comprising:
generating a sensor current by a light sensor and providing the sensor current to a summation node,
providing a source current by a current source to the summation node,
generating an integrator signal by an integrator coupled to the summation node, wherein a first value of the integrator signal is generated by integrating during a first phase and a second value of the integrator signal is generated by integrating during a second phase, and
generating an analog output signal by a sum and hold circuit as a function of a difference of the first value and the second value of the integrator signal.

* * * * *